US009431403B2

(12) United States Patent
Komeda

(10) Patent No.: US 9,431,403 B2
(45) Date of Patent: Aug. 30, 2016

(54) SEMICONDUCTOR DEVICE AND METHOD FOR MANUFACTURING THE SAME

(71) Applicant: PS4 Luxco S.a.r.l., Luxembourg (LU)

(72) Inventor: Kenji Komeda, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/435,453

(22) PCT Filed: Oct. 2, 2013

(86) PCT No.: PCT/JP2013/076799
§ 371 (c)(1),
(2) Date: Apr. 13, 2015

(87) PCT Pub. No.: WO2014/057848
PCT Pub. Date: Apr. 17, 2014

(65) Prior Publication Data
US 2015/0279842 A1 Oct. 1, 2015

(30) Foreign Application Priority Data
Oct. 9, 2012 (JP) ................................ 2012-223955

(51) Int. Cl.
| H01L 27/10 | (2006.01) |
| H01L 27/108 | (2006.01) |
| H01L 49/02 | (2006.01) |
| H01L 21/00 | (2006.01) |

(52) U.S. Cl.
CPC ... *H01L 27/10814* (2013.01); *H01L 27/10852* (2013.01); *H01L 27/10894* (2013.01); *H01L 28/91* (2013.01)

(58) Field of Classification Search
None
See application file for complete search history.

(56) References Cited

U.S. PATENT DOCUMENTS

| 2010/0148236 A1 | 6/2010 | Kadoya |
| 2012/0038052 A1 | 2/2012 | Wang |

OTHER PUBLICATIONS

Application No. PCT/JP2013/076799, International Search Report, Jan. 28, 2014.

*Primary Examiner* — Evren Seven
(74) *Attorney, Agent, or Firm* — Kunzler Law Group, PC

(57) ABSTRACT

A semiconductor device provided with a capacitor that includes a plurality of cylindrical or columnar storage electrodes provided periodically on a semiconductor substrate, capacitor insulation films that cover the wall surfaces of the storage electrodes, and first conductive films provided on the capacitor insulation film and facing the storage electrodes, wherein the first conductive films of the capacitors adjacent in a first direction in which the storage electrodes are arranged are in contact with each other, and the first conductive films of capacitors adjacent in remaining other directions in which the storage electrodes are arranged are separated from each other.

21 Claims, 18 Drawing Sheets

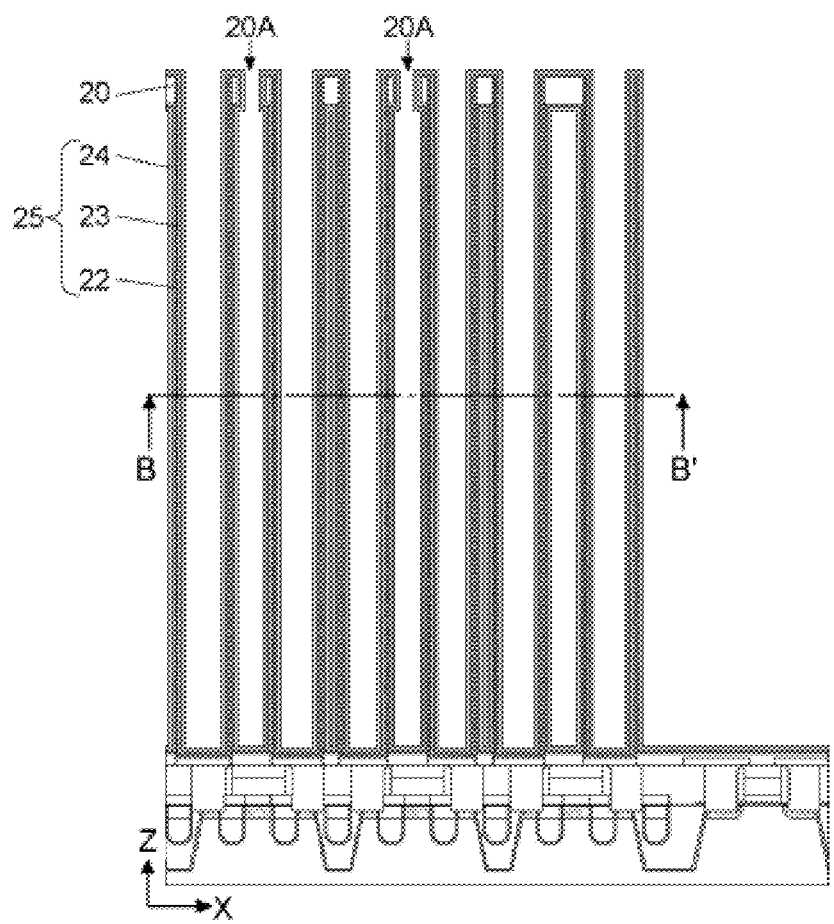

SEMICONDUCTOR DEVICE AND METHOD FOR MANUFACTURING THE SAME

TECHNICAL FIELD

The present invention relates to a semiconductor device, and in particular relates to the arrangement of capacitors in a DRAM (Dynamic Random Access Memory) or the like.

BACKGROUND ART

In DRAMs, which are a type of semiconductor device, miniaturization has led to the predominant use of three-dimensional capacitors such as crown-type capacitors, and with these a structure is adopted whereby, after a storage electrode (lower electrode) has been formed, the upper portions of the storage electrode are connected using a beam to prevent collapse. The beam has an open portion, the configuration being devised so as not to interfere with processes such as the removal of a sacrificial oxide film (an interlayer film used to form the electrodes). In recent years, in order to maintain capacitance as miniaturization has progressed further, attempts have been made to maintain the capacitance by reducing the gaps between the capacitative cylinders, thereby widening the electrodes.

For example, patent literature article 1 discloses, in paragraph [0002], a way of gaining capacitor surface area by forming a plurality of crown-type (circular tube-type) storage electrodes standing close together, and covering the insides and outsides of the storage electrodes with a capacitative insulating film and an upper electrode. In FIG. 13 of patent literature article 1, upper electrodes are formed between adjacent capacitors in such a way as to be in contact with one another in a direction that is perpendicular to the substrate.

PATENT LITERATURE

Patent literature article 1: Japanese Patent Kokai 2008-283026

SUMMARY OF THE INVENTION

Problems to be resolved by the invention

The capacitative insulating film and the upper electrode are formed by supplying a feed gas from the open portions of the abovementioned beam. When forming the upper electrodes, in particular, the upper electrodes continue to form while the gas is supplied, in the sections that face the open portions of the beam, and forming continues until the upper electrodes come into contact with one another. However, the inventor has found that in the sections that do not face the open portions of the beam, the gas supply stagnates as a result of the fact that the upper electrodes are in contact with one another, and in some cases variability arises in the film thickness of the upper electrode. This problem does not arise if the number of openings in the beam is increased, but this reduces the strength of the beam, causing the storage electrodes to collapse. The reduction in beam strength becomes a problem if one storage electrode adjoins two or more beam openings.

Means of Overcoming the Problems

In the present invention, an upper electrode is formed while at the same time the flow of feed gas is maintained, by arranging that capacitors arranged periodically are closed in one direction by means of a first conductive film which forms the upper electrode, and that the remaining directions between adjacent storage electrodes are not closed, while at the same time the surface area that defines the storage capacitance is maintained.

In other words, according to one mode of embodiment of the present invention there is provided a semiconductor device provided with capacitors which contain a plurality of circular tube-type or column-type storage electrodes provided upright in a periodic manner on a semiconductor substrate, capacitative insulating films covering wall surfaces of the storage electrodes, and first conductive films on the capacitative insulating films, on the opposite side to the storage electrodes, characterized in that in a first direction in which the storage electrodes are disposed, the first conductive films of adjacent capacitors are in contact with one another in a direction perpendicular to the semiconductor substrate, and in the remaining other direction in which the storage electrodes are disposed, the first conductive films of adjacent capacitors are separated from one another in the direction perpendicular to the semiconductor substrate.

Advantages of the Invention

According to the first mode of embodiment of the present invention, when the first conductive films which form the upper electrodes of the capacitors are being deposited, a direction of flow for the feed gas is maintained even after one direction has been closed, and gas is supplied uniformly even to the outer wall portions of the storage electrodes that do not face the open portions of the beam, and therefore variability in the thickness of the first conductive film is less liable to occur, and deterioration in the capacitor characteristics can be prevented. As a result, the number of open portions in the beam can be reduced while the effective surface area of the storage electrodes is maintained, and therefore a reduction in the beam strength can be suppressed.

BRIEF EXPLANATION OF THE DRAWINGS

FIG. 10B is a longitudinal cross-sectional view along the line A-A' in FIG. 10A.

MODES OF EMBODYING THE INVENTION

Specific exemplary embodiments of the present invention will now be described with reference to the drawings, but the present invention is not limited only to these exemplary embodiments.

Figure 1A:
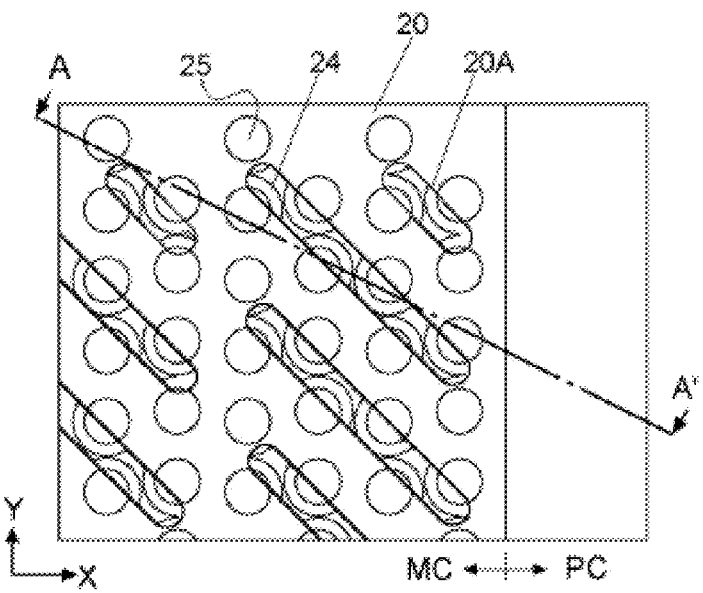
FIG. 1A is a plan view used to describe the arrangement of capacitors in a conventional structure.
Figure 1B:
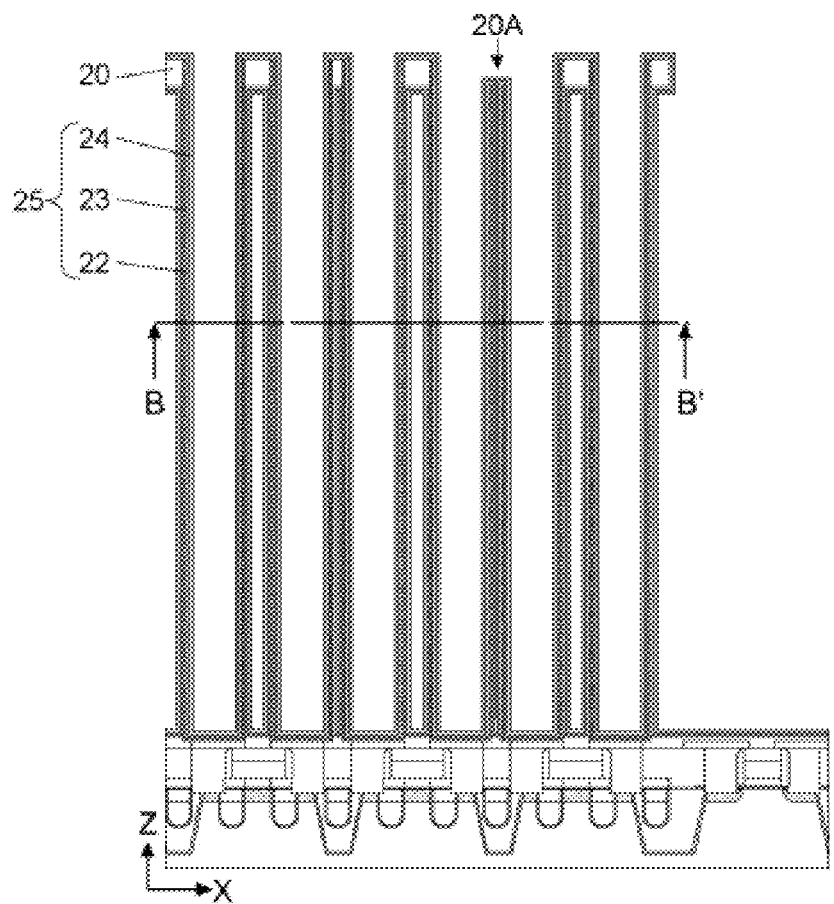
FIG. 1B is a longitudinal cross-sectional view along the line A-A' in FIG. 1A.
Figure 1C:
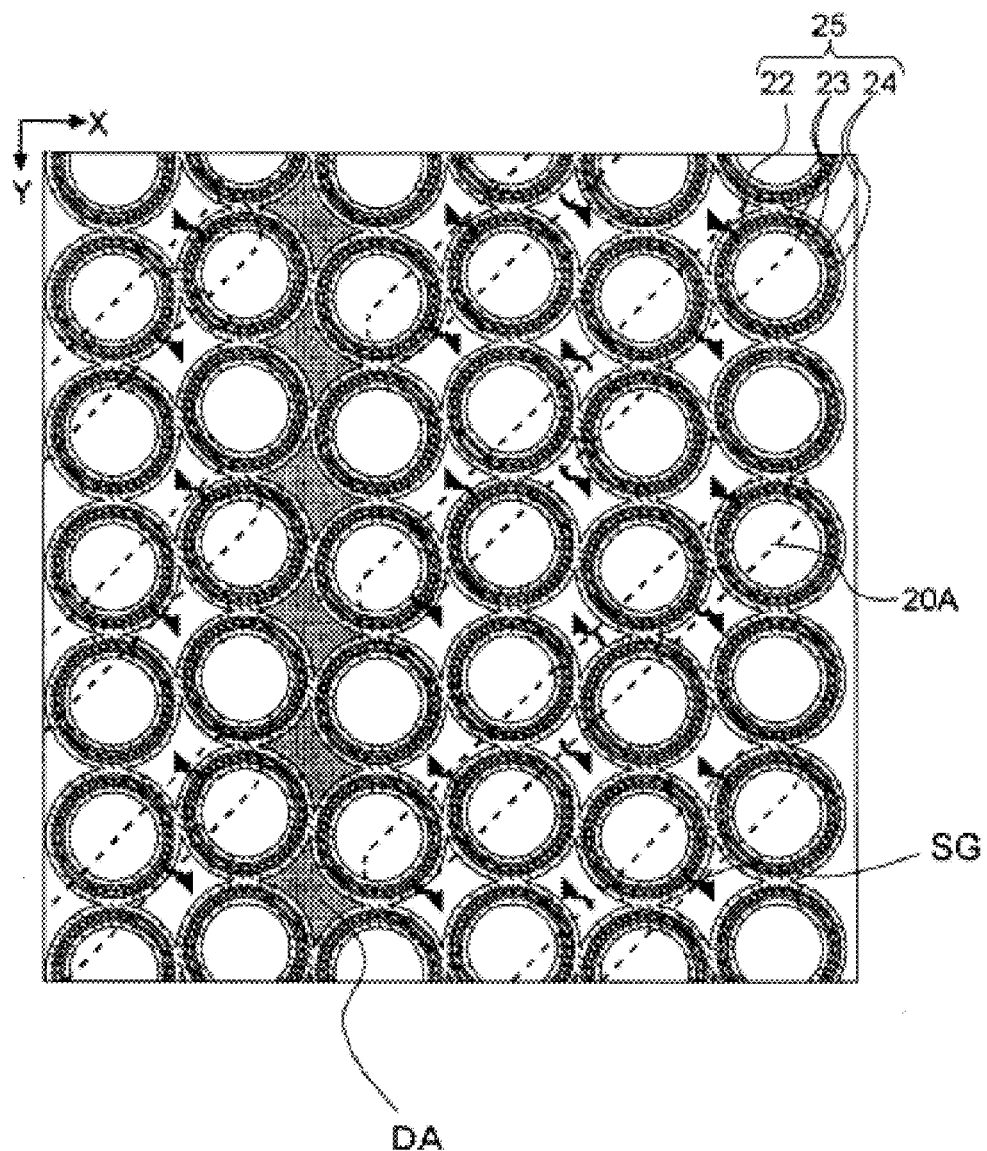
FIG. 1C is a transverse cross-sectional view along the line B-B' in FIG. 1B.

The conventional structure in question will first be described with reference to FIG. 1. FIG. 1A to FIG. 1C illustrate a state in which processes have been performed as far as the formation of a first conductive film 24 constituting part of an upper electrode, where FIG. 1A is a plan view illustrating a portion in the vicinity of a boundary between a memory cell region MC and a peripheral circuit region PC. FIG. 1B is a longitudinal cross-sectional view along the line A-A' in FIG. 1A, and FIG. 1C is a transverse cross-sectional view along the line B-B' in FIG. 1B. Storage electrodes 22 of capacitors 25 have a bottomed circular tube-type (crown-type) shape, dielectric films 23 are formed on the inner walls and the outer walls thereof, and a first conductive film 24 which constitutes part of an upper electrode is formed thereon. In the storage electrodes 22, cylinder holes are formed in a core insulating film (which is not shown in the drawings) which forms a molding frame, and in a support film 20 which forms a beam, a conductive film such as titanium nitride (TiN) is deposited on the inner walls thereof, and the core insulating film is then removed to expose the outer walls. Open portions 20A are formed in the support film 20 in order to allow penetration of a chemical liquid for removal of the core insulating film. After the core insulating film has been removed, a feed gas SG for depositing the capacitative insulating film 23 and the first conductive film 24 is introduced from the open portions 20A provided in the support film 20, thereby forming the storage electrode 22 outer wall portions below the support film 20. The storage electrodes 22 are formed using a dense arrangement such as a hexagonal close-packed arrangement, to cope with miniaturization, but in order to gain a prescribed capacitance they are formed with as large a bore diameter as possible. The first conductive films 24 are formed in such a way as to be connected to one another in the gaps between the storage electrodes, and once they have become connected, the supply of the feed gas SG is interrupted. As a result, although film deposition progresses further on the outer walls of the storage electrode facing the open portions of the support film, the supply of the feed gas SG in the sections which do not face the open portions is interrupted, and defective areas DA having a non-uniform film thickness are formed (see FIG. 1C). Further, after the first conductive film 24 has been deposited, a second conductive film (doped polysilicon or the like) is additionally formed to fill voids in the inner walls of the storage electrodes and gaps between the storage electrodes, but because the first conductive films are joined together, the second conductive film 2 is not formed in the defective areas DA. As a result there is a risk that the mechanical strength will deteriorate. The defective areas DA can be eliminated by increasing the number of open portions 20A formed in the support film 20, but the mechanical strength of the support film 20 which serves as a beam deteriorates, and the storage electrodes 22 are liable to collapse, for example, when the core insulating film is removed.

In the present invention, in order to resolve such problems, regions are provided in which the first conductive films are not joined together, thereby making it possible for regions that do not face the open portions to be supplied with the feed gas even after some of the first conductive films have been joined together, and in addition arrangements are made such that the second conductive film can be formed in the regions which do not face the open portions.

(Exemplary Embodiment 1)

Figure 2A:
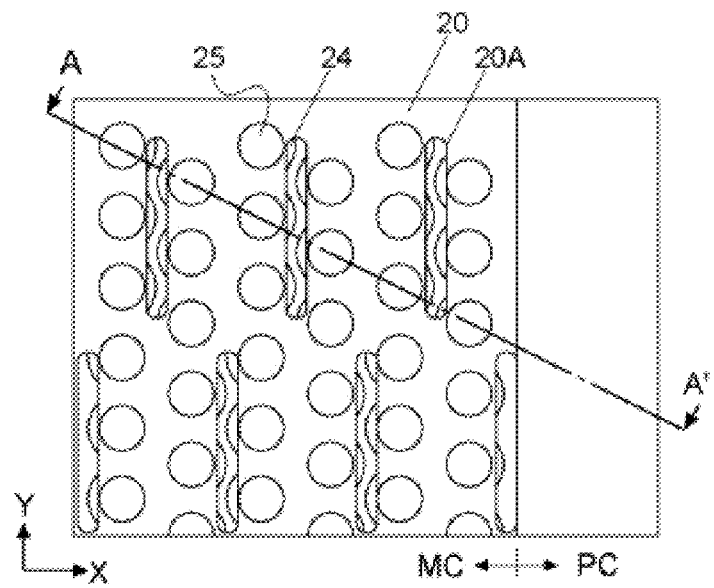
FIG. 2A is a plan view used to describe the arrangement of capacitors in exemplary embodiment 1 of the present invention.
Figure 2B:
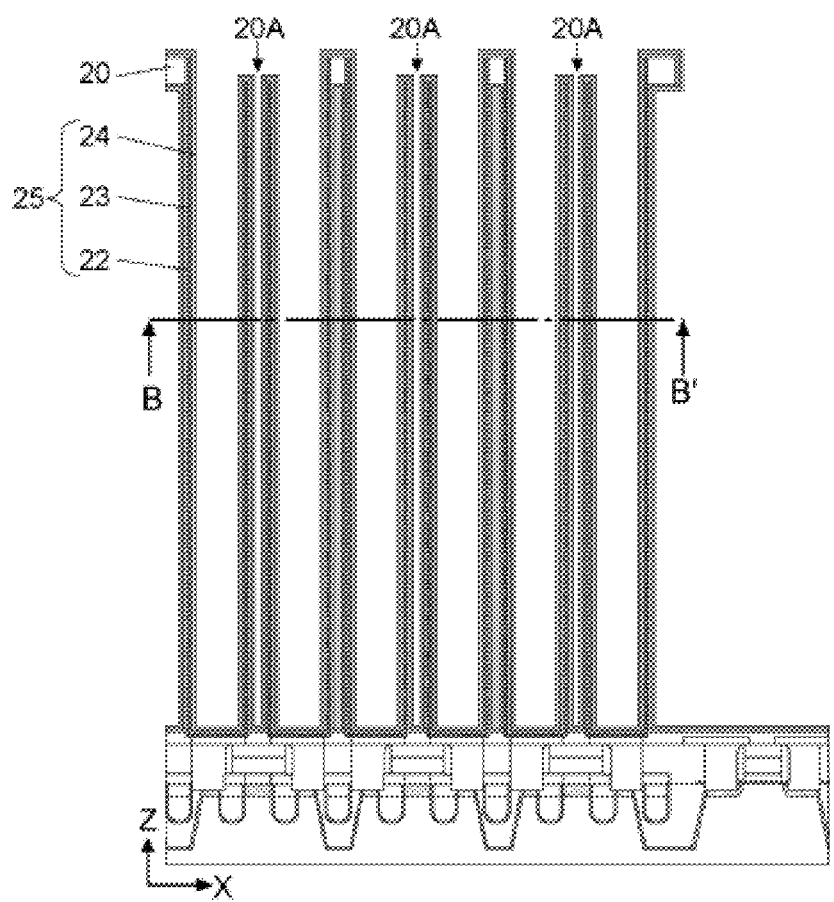
FIG. 2B is a longitudinal cross-sectional view along the line A-A' in FIG. 2A.
Figure 2C:
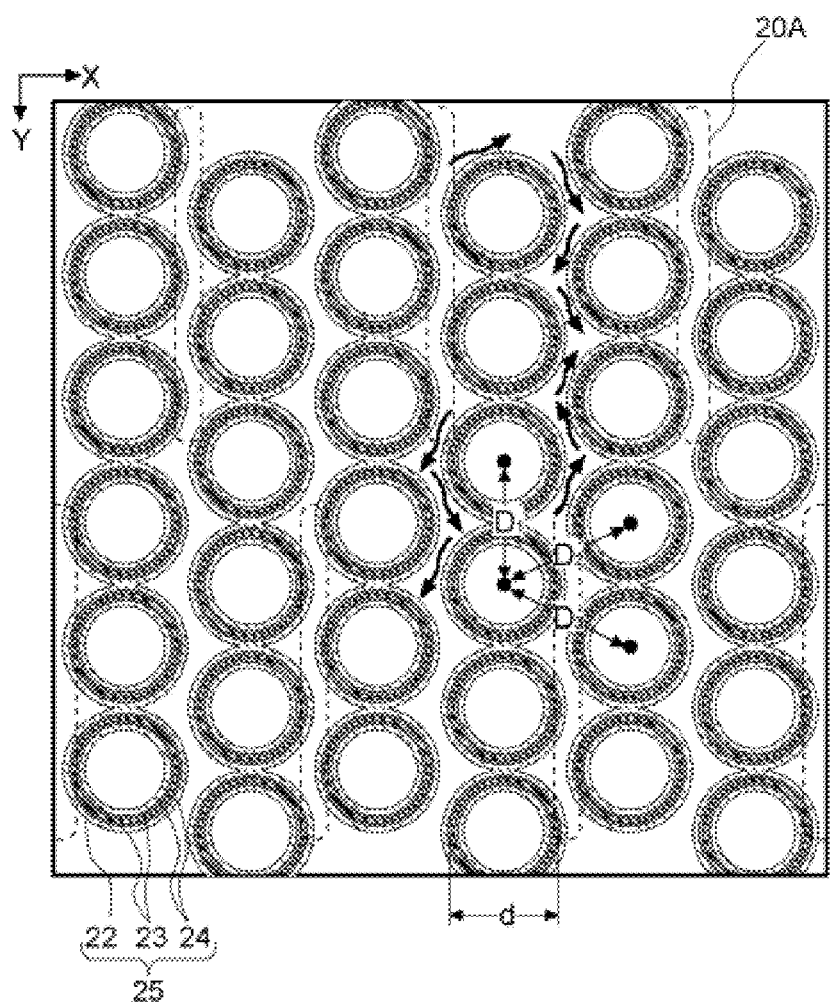
FIG. 2C is a transverse cross-sectional view along the line B-B' in FIG. 2B.

FIG. 2A to FIG. 2C illustrate a state in which processes have been performed as far as the formation of a first conductive film 24 constituting part of an upper electrode in a semiconductor device according to this mode of embodiment, where FIG. 2A is a plan view, FIG. 2B is a longitudinal cross-sectional view along the line A-A' in FIG. 2A, and FIG. 2C is a transverse cross-sectional view along the line B-B' in FIG. 2B.

As illustrated in FIG. 2C, the disposition of the storage electrodes is such that, if the center-to-center distance (first center-to-center distance) between the storage electrodes in the Y-direction is $D_1$, the respective center-to-center distances (respectively the second and third center-to-center distances) in the other two directions are respectively $D_2$ and $D_3$, the outer diameter of the cylinder holes forming the storage electrodes is d, the thickness of the capacitative insulating film is s and the thickness of the first conductive film 24 is t, the diameter and disposition of the storage electrodes 22 are adjusted such that:

$$(2 \times s + t) \leq D_1 - d \leq 2 \times (s+t)$$

$$2 \times (s+t) < D_2 - d$$

$$2 \times (s+t) < D_3 - d$$

$$D_1 < D_2, D_1 < D_3$$

$D_1$–d, $D_2$–d and $D_3$–d respectively correspond to the gap between the storage electrodes in the Y-direction, and the gaps between the storage electrodes in the other two directions. In other words, in the Y-direction (first direction), the first conductive films 24 are joined to one another, with a film thickness at least equivalent to one layer of the first conductive film 1, but in the other directions (where the $D_2$ direction is referred to as the second direction, and the $D_3$ direction is referred to as the third direction) the first conductive films 24 do not come into contact with one another, and a gap is maintained therebetween.

By this means, the strength of the support film 20 which forms the beams can be maintained, and a flow path for the film-deposition feed gas can be ensured, while maximizing the surface area of the storage electrodes, and variability in the thickness of the first storage electrodes can be reduced. A flow path for the feed gas for the second conductive film, in a subsequent process, can also be ensured. As a result, deterioration in the capacitor characteristics can be prevented.

Figure 3A:
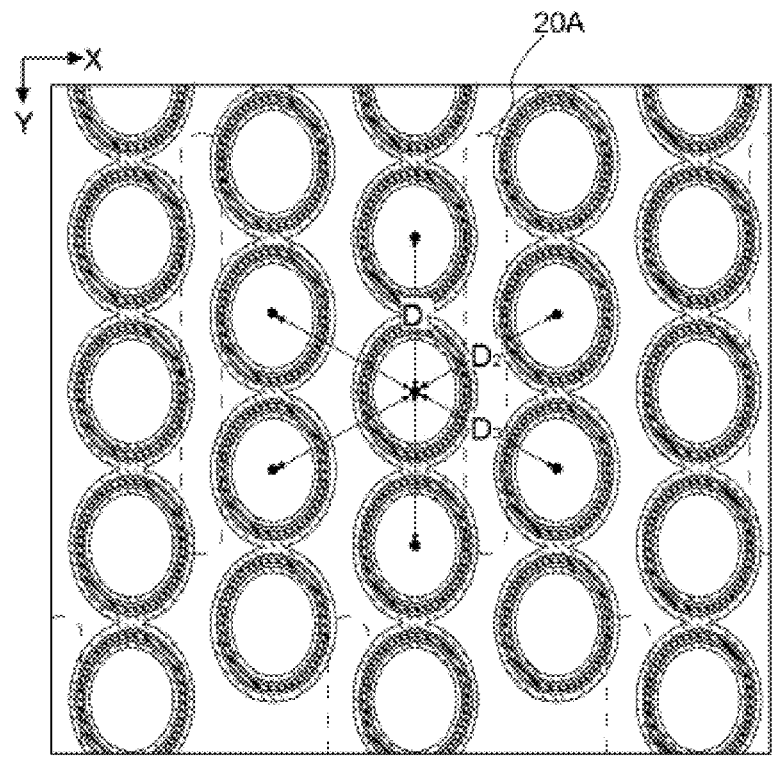
FIG. 3A is a drawing illustrating a modified example of a storage electrode, corresponding to FIG. 2C.
Figure 3B:
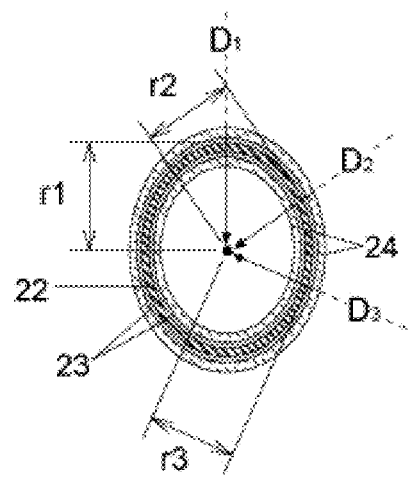
FIG. 3B is a partial enlarged view of FIG. 3A.

In this example, the peripheral shape of the outside surface of the storage electrodes 22 (in other words the planar shape of the cylinder holes) is substantially circular, and the example illustrates a hexagonal arrangement in which six storage electrodes 22 are disposed adjacent to each storage electrode 22. In this case, the center-to-center distances $D_2$ and $D_3$ are larger than the center-to-center distance $D_1$. Making the center-to-center distances $D_2$ and $D_3$ equal to each other allows the disposition of the storage electrodes to have good periodicity. However, it is also possible for all of the center-to-center distances $D_1$, $D_2$ and $D_3$ to be the same ($D_1=D_2=D_3$), or for $D_1$ to be larger than $D_2$ and $D_3$, and in this case, as illustrated in FIG. 3A, the peripheral shape of the outside surface of the storage electrodes 22 is an elliptical shape having a major diameter in the first direction. FIG. 3B is an enlarged transverse cross-sectional view of one capacitor.

Here, if the radius (the distance from the center to the cylinder hole wall surface) in the $D_1$ direction is r1, the radius in the $D_2$ direction is r2, and the radius in the $D_3$ direction is r3, then the configuration is such that:

$$D_1 - 2 \times (s+t) \leq 2 \times r1 \leq D_1 - (2 \times s + t)$$

$$2 \times r2 < D_2 - 2 \times (s+t)$$

$$2 \times r3 < D_3 - 2 \times (s+t)$$

In this case also, making the center-to-center distances $D_2$ and $D_3$ equal to each other allows the disposition of the storage electrodes to have good periodicity.

In this mode of embodiment, the open portions 20A formed in the support film 20 have a substantially rectangular shape having a longitudinal direction in the direction (Y-direction) in which the first conductive films 24 are joined to one another, and a lateral direction in another direction (X-direction). The first conductive films 24 of adjacent capacitors facing an open portion 20A are separated from one another, as illustrated in FIG. 2A. In this mode of embodiment, the width of the openings in the longitudinal direction of the open portions 20A (referred to hereinafter as the length) is preferably approximately two to three times the center-to-center distances ($D_1$, $D_2$, $D_3$) between the storage electrodes, in order to maintain the strength of the support film 20 which forms the beams. In other words, the open portions 20A are provided in such a way as to adjoin with three capacitors respectively on one side surface (first side surface) side in the longitudinal direction and on a second side surface side which opposes the first side surface. Further, the width of the openings in the lateral direction (referred to hereinafter as the width) is preferably as large as possible, to the extent that the strength of the support film 20 which forms the beams can be maintained. The width is preferably less than the center-to-center distances ($D_1$, $D_2$, $D_3$) between the storage electrodes. Meanwhile, the width of the open portions 20A is set to a width whereby the open portions 20A are not closed even after the capacitative insulating film and the first conductive film have been formed, in other words a width that is greater than the sum of twice the thickness of the first conductive film and twice the thickness of the capacitative insulating film [2×(s+t)]. The width of the open portions 20A is preferably within a similar range in the other modes of embodiment also.

A method of manufacturing the semiconductor device in this exemplary embodiment will now be described with reference to FIGS. 4 to 8. FIG. 4A, FIG. 5A, FIG. 6A and FIG. 7A are each plan views, and FIG. 4B, FIG. 5B, FIG. 6B, FIG. 7B and FIG. 8B are each longitudinal cross-sectional views through the line A-A'.

Figure 4A:
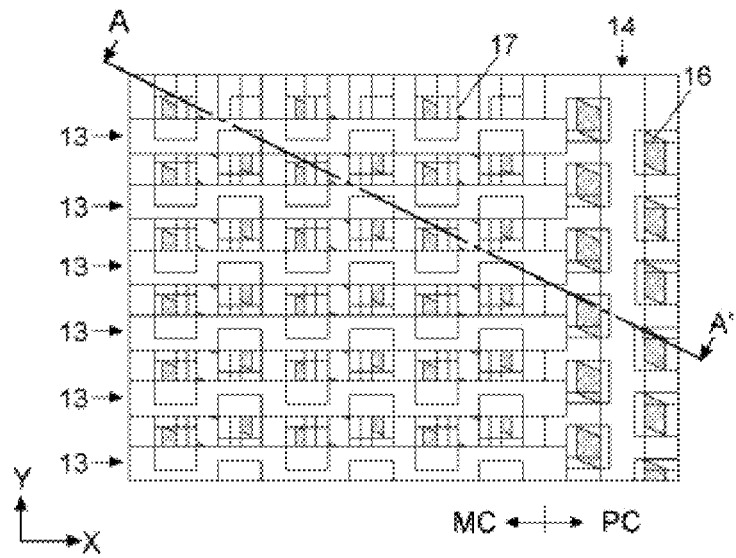
FIG. 4A is a plan view used to described a process for manufacturing the semiconductor device in exemplary embodiment 1 of the present invention.
Figure 4B:
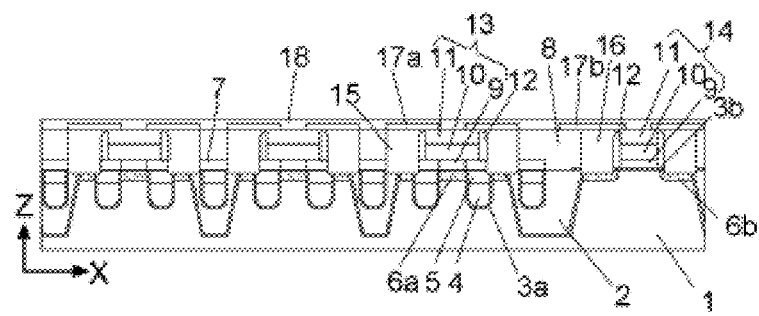
FIG. 4B is a longitudinal cross-sectional view along the line A-A' in FIG. 4A.

First, as illustrated in FIGS. 4A and 4B, known techniques are used as far as the formation of capacitance pads 17a of the semiconductor device (DRAM) and the deposition of a stop film 18. The drawings illustrate embedded word line type memory cells, but other forms may also be used. Element isolation regions 2 are first formed in a semiconductor substrate 1, after which grooves for embedded gate electrodes are formed in a memory cell region MC, and gate insulating films 3a, gate electrodes 4 and embedded insulating films 5 are formed successively. Bit contact interlayer films 7 are also formed in the memory cell region MC. Next, gate insulating films 3b are formed in a peripheral circuit region PC, after which a doped polysilicon film 9, a metal film 10 and a cap insulating film 11 are deposited successively. At this time, bit contact holes are formed in advance in the bit contact interlayer film 7 in the memory cell region MC. Diffusion layers 6a are formed in the semiconductor substrate 1 that is in contact with bit contacts, by thermally diffusing an impurity from the doped polysilicon film 9. The doped polysilicon film 9, the metal film 10 and the cap insulating film 11 are then patterned, bit lines 13 are formed in the memory cell region, and peripheral transistor gate electrodes 14 are formed in the peripheral circuit region PC. Further, side walls 12 are formed on the sidewalls of the bit lines 13 and the peripheral transistor gate electrodes 14. An interlayer insulating film 8 such as a silicon dioxide film is formed over the entire surface, contact holes are formed respectively in the memory cell region MC and the peripheral circuit region PC, and diffusion layers 6b are formed by ion implantation of an impurity into the semiconductor substrate by way of the contact holes. Further, by embedding conductive films, capacitative contact plugs 15 are formed in the memory cell region MC and source/drain contact plugs 16 are formed in the peripheral circuit region PC. Conductive films 17 are deposited on the interlayer insulating film 8 to form capacitance pads 17a and a wiring layer 17b respectively in the memory cell region and the peripheral circuit region PC. Further, a stop film 18 such as a silicon nitride film is formed covering these.

Figure 5A:
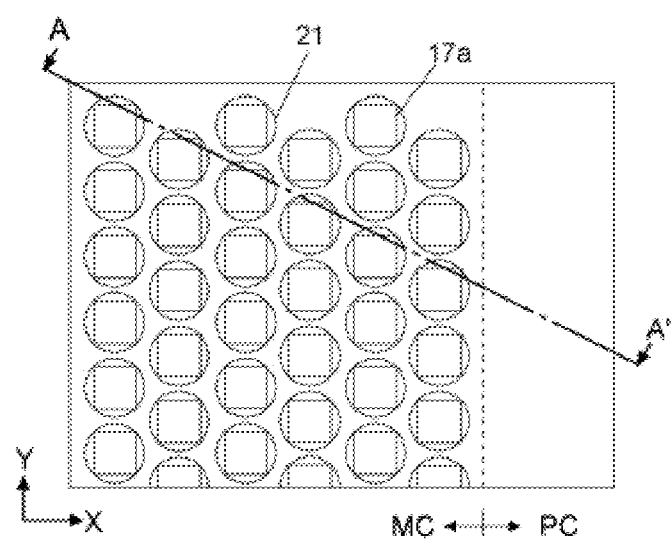
FIG. 5A is a plan view used to described the process for manufacturing the semiconductor device in exemplary embodiment 1 of the present invention.
Figure 5B:
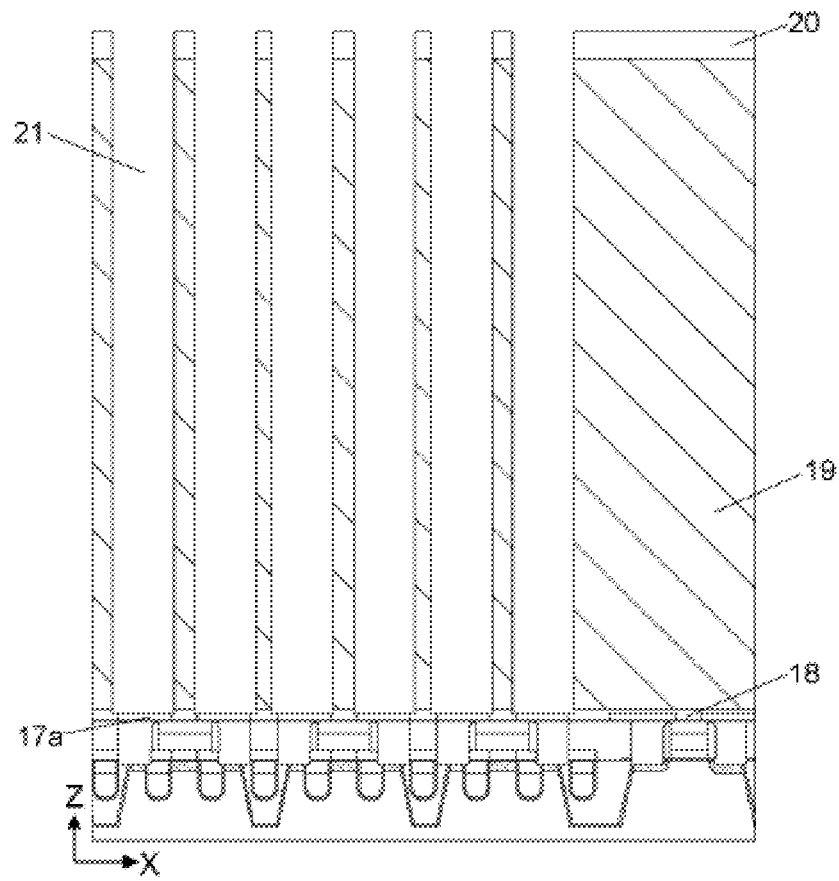
FIG. 5B is a longitudinal cross-sectional view along the line A-A' in FIG. 5A.

Next, as illustrated in FIGS. 5A and 5B, a core insulating film 19 comprising a silicon dioxide film, and a support film 20 comprising a silicon nitride film are deposited, and cylinder holes 21 are formed, exposing the capacitance pads 17a in the memory cell region. The cylinder holes 21 are formed in such a way as to have a prescribed shape and disposition, applying the present invention.

Figure 6A:
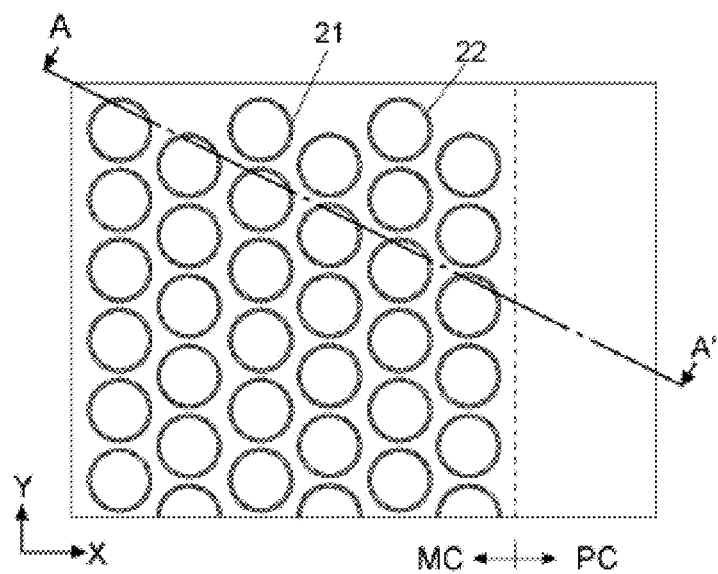
FIG. 6A is a plan view used to described the process for manufacturing the semiconductor device in exemplary embodiment 1 of the present invention.
Figure 6B:
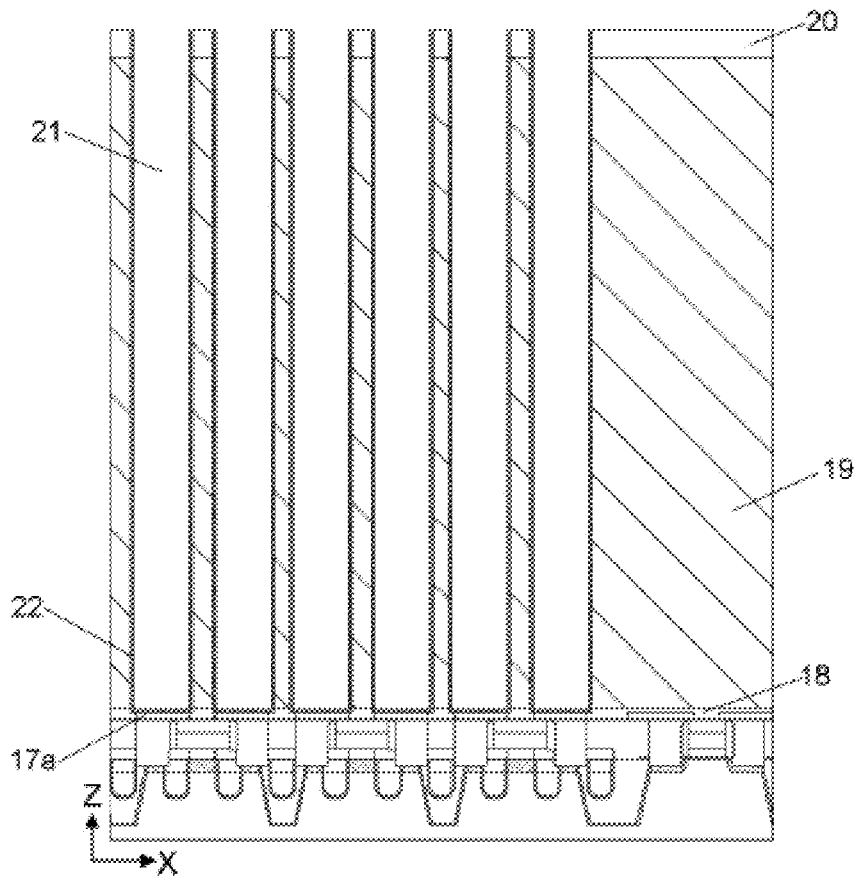
FIG. 6B is a longitudinal cross-sectional view along the line A-A' in FIG. 6A.

Next, as illustrated in FIGS. 6A and 6B, TiN is deposited inside the cylinder holes 21, and the surplus TiN film on the support film 20 is removed, to form storage electrodes 22.

Figure 7A:
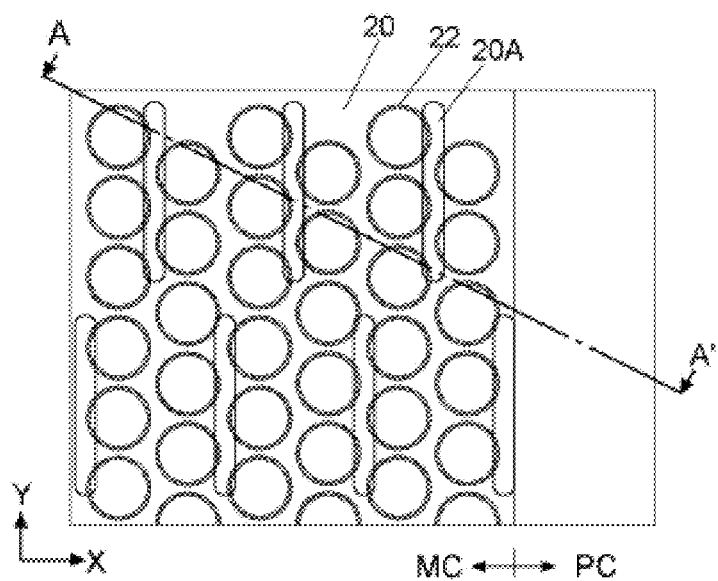
FIG. 7A is a plan view used to described the process for manufacturing the semiconductor device in exemplary embodiment 1 of the present invention.
Figure 7B:
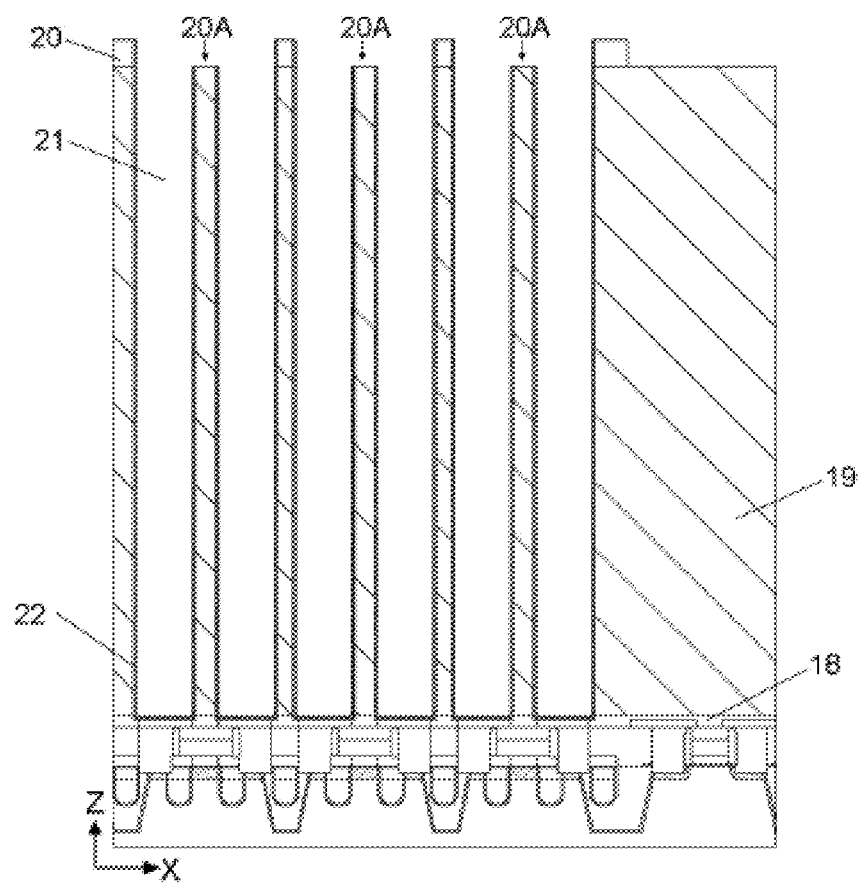
FIG. 7B is a longitudinal cross-sectional view along the line A-A' in FIG. 7A.

Further, as illustrated in FIGS. 7A and 7B, open portions 20A are formed in the support film 20. In the peripheral circuit region, the support film 20 is removed such that the core insulating film 19 is exposed over the entire surface. Next, the core insulating film 19 is removed by wet etching using hydrofluoric acid, to expose the outer walls of the storage electrodes 22. A capacitative insulating film 23 and a first conductive film 24 are then formed, thereby completing the structure illustrated in FIG. 2. A known capacitative insulating film (for example a zirconium oxide film) can be used as the capacitative insulating film 23, and a TiN film can for example be used as the first conductive film 24. The first conductive films 24 constitute part of the upper electrodes of capacitors 25, and in this mode of embodiment the film thickness is such that gaps between the outer walls of storage electrodes 22 that are adjacent in the Y-direction are filled, and gaps in other directions remain.

Figure 8:
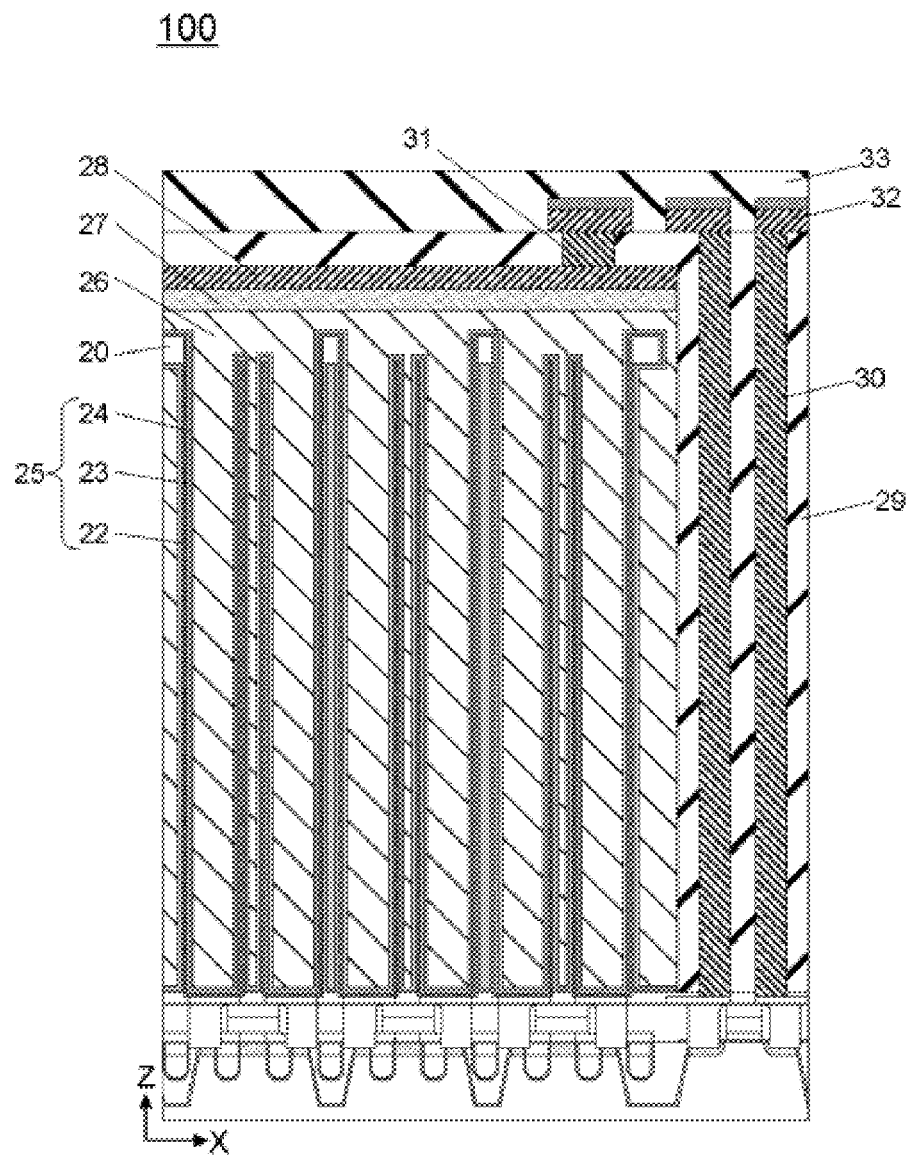
FIG. 8 is a longitudinal cross-sectional view used to describe the manufacture of a semiconductor device 100 in exemplary embodiment 1 of the present invention.

Next, as illustrated in FIG. 8, a filling film (second conductive film) 26 such as a doped polysilicon film, a bonding film 27 and a plate electrode 28 are formed, and the filling film 26, the bonding film 27 and the plate electrode 28 in the peripheral circuit region PC are removed by lithography and dry etching. The first conductive films 24, the filling film 26, the bonding film 27 and the plate electrode 28 are collectively referred to as upper electrodes. A protective oxide film 29 is then deposited and is planarized by CMP. Wiring line contacts 30 and 31 and wiring lines 32 are then formed, and are covered by a protective nitride film 33. This completes the semiconductor device 100 according to this mode of embodiment.

(Exemplary Embodiment 2)

Figure 9A:
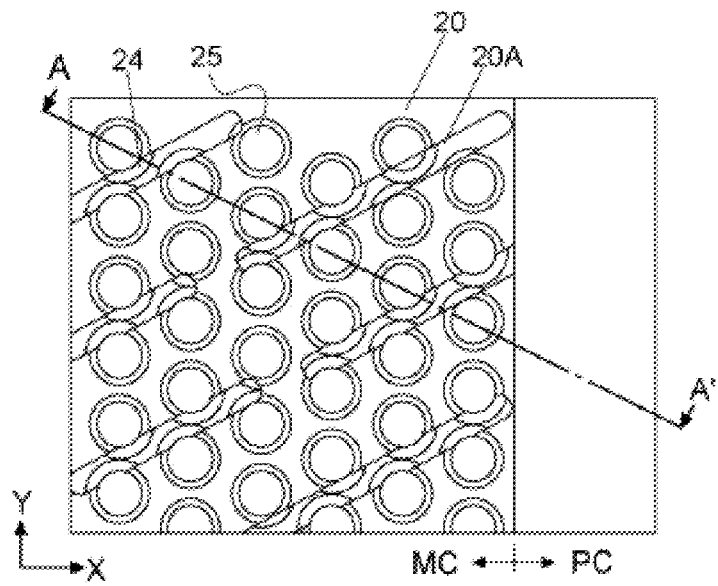
FIG. 9A is a plan view used to describe the arrangement of capacitors in exemplary embodiment 2 of the present invention.
Figure 9B:
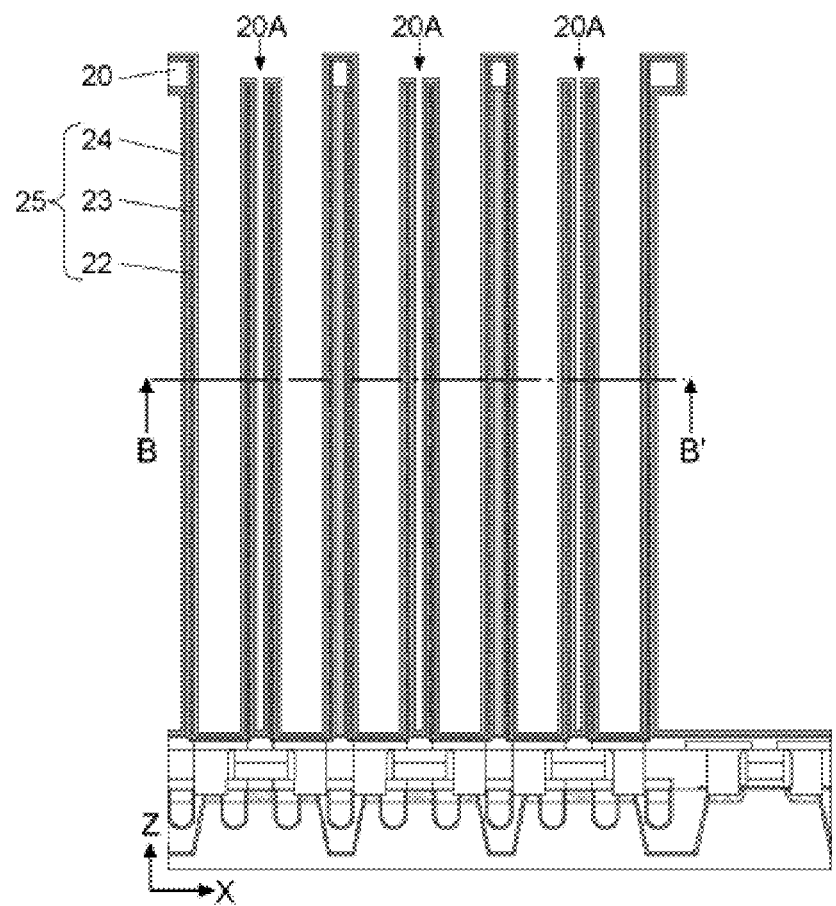
FIG. 9B is a longitudinal cross-sectional view along the line A-A' in FIG. 9A.
Figure 9C:
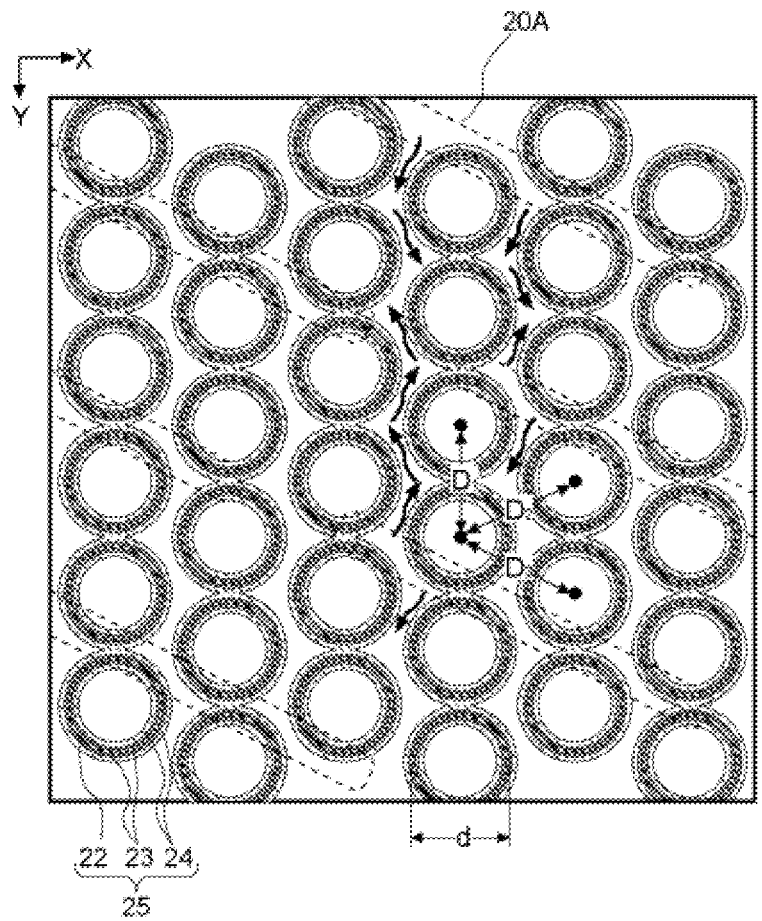
FIG. 9C is a transverse cross-sectional view along the line B-B' in FIG. 9B.

FIG. 9A to FIG. 9C illustrate a state in which processes have been performed as far as the formation of a first conductive film 24 constituting part of an upper electrode in a semiconductor device according to this mode of embodiment, where FIG. 9A is a plan view, FIG. 9B is a longitudinal cross-sectional view along the line A-A' in FIG. 9A, and FIG. 9C is a transverse cross-sectional view along the line B-B' in FIG. 9B.

In this mode of embodiment the arrangement of the capacitors is the same as in exemplary embodiment 1, but the open portions 20A formed in the support film 20 are formed in such a way as to have a longitudinal direction in a direction (second or third direction) that is different from the first direction. Thus the first conductive films 24 of capacitors that are adjacent in the first direction and face the open portions 20A are in contact with one another in a direction perpendicular to the semiconductor substrate, and the first conductive films 24 of capacitors that are adjacent in the remaining other directions and face the open portions 20A are separated from one another in a direction perpendicular to the semiconductor substrate. In this mode of embodiment there is no particular limit to the length of the open portions 20A.

(Exemplary Embodiment 3)

Figure 10A:
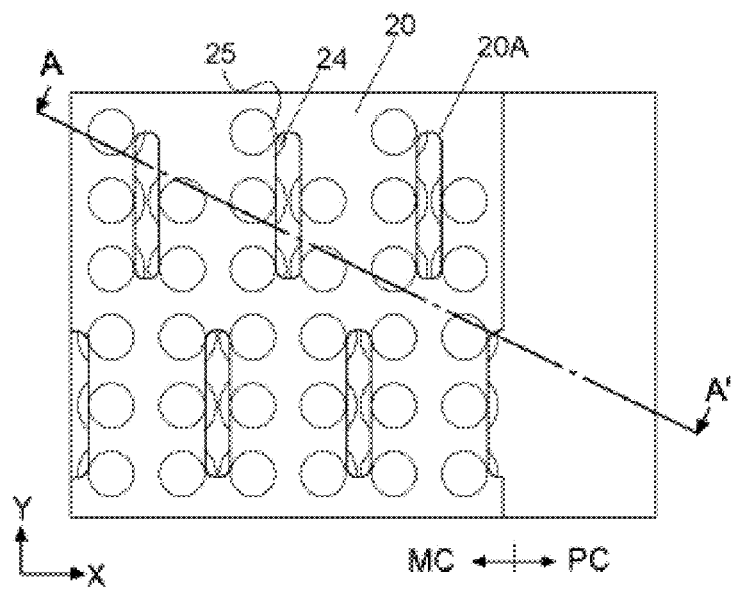
FIG. 10A is a plan view used to describe the arrangement of capacitors in exemplary embodiment 3 of the present invention.
Figure 10C:
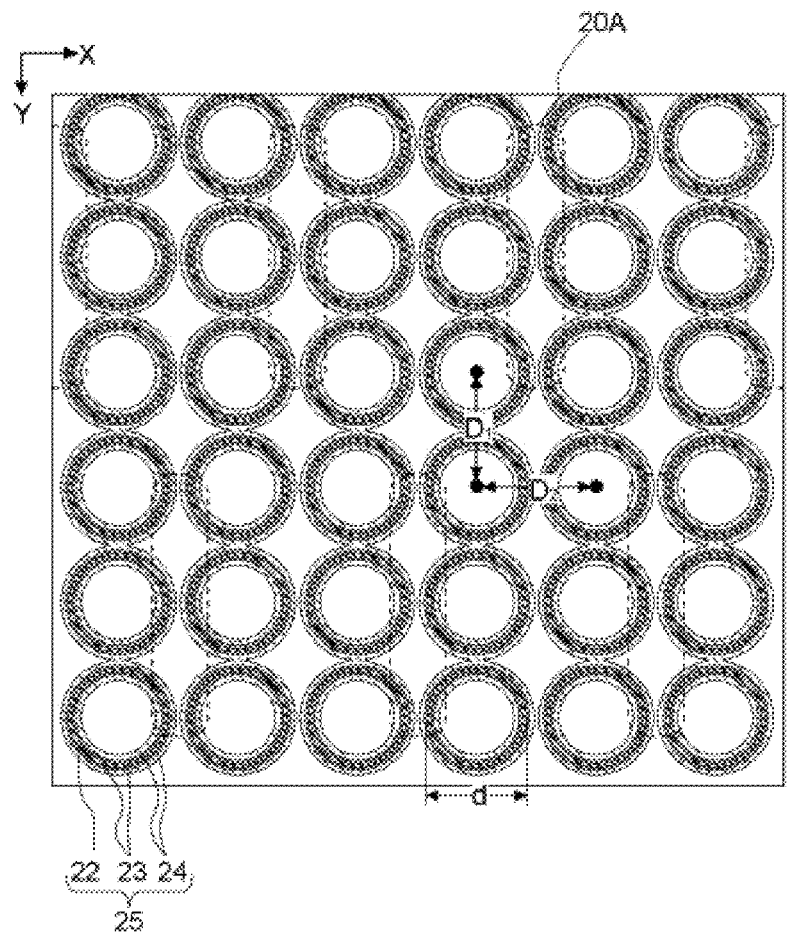
FIG. 10C is a transverse cross-sectional view along the line B-B' in FIG. 10B.

In exemplary embodiments 1 and 2 described hereinabove, the capacitors are disposed in a hexagonal arrangement, but the present invention is not limited to a hexagonal arrangement, and the present invention can also be applied to a four-way arrangement in which the capacitors are disposed in row and column directions. FIG. 10A to FIG. 10C illustrate a state in which processes have been performed as far as the formation of a first conductive film 24 constituting part of an upper electrode in a semiconductor device according to this mode of embodiment, where FIG. 10A is a plan view, FIG. 10B is a longitudinal cross-sectional view along the line A-A' in FIG. 10A, and FIG. 10C is a transverse cross-sectional view along the line B-B' in FIG. 10B.

As illustrated in FIG. 10C, in a case in which roughly circular storage electrodes 22 are formed, the gap $D_1$ between each row (in the Y-direction: first direction) is smaller than the gap $D_2$ between each column (in the X-direction: second direction), and if the diameter of the cylinder holes 21 is d, the thickness of the capacitative insulating film 23 is s and the thickness of the first conductive film 24 is t, the diameter and disposition of the storage electrodes are adjusted such that:

$$(2 \times s + t) \le D_1 - d \le 2 \times (s + t)$$

$$2 \times (s + t) < D_2 - d$$

Further, the open portions 20A formed in the support film 20 are formed between each row, with a shape having a longitudinal direction in the Y-direction (first direction), and they are disposed in a staggered formation such that each capacitor 25 faces one open portion 20A. It should be noted that in this example the capacitors 25 are formed in such a way as to face one open portion 20A, but there may also be capacitors 25 that do not face an open portion 20A. In this mode of embodiment the length of the open portions 20A is preferably approximately two to three times the center-to-center distance $D_1$ or $D_2$ between the storage electrodes, in the same way as in exemplary embodiment 1, from the viewpoint of maintaining its strength as a beam.

Further, if $D_1 \ge D_2$, then as illustrated in FIG. 3, by adopting an elliptical shape having a major diameter in the Y-direction (first direction), the structure can be such that the first conductive films 24 are connected to one another in the Y-direction and are separated from one another in the X-direction.

(Exemplary Embodiment 4)

Figure 11A:
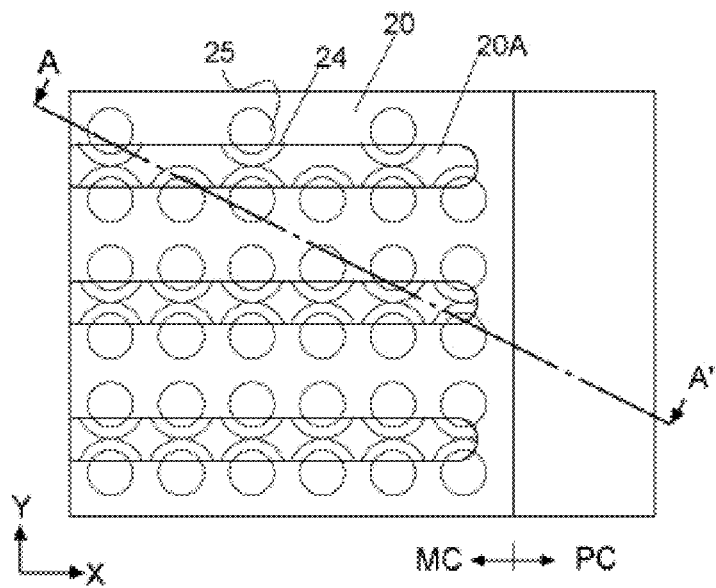
FIG. 11A is a plan view used to describe the arrangement of capacitors in exemplary embodiment 4 of the present invention.
Figure 11B:
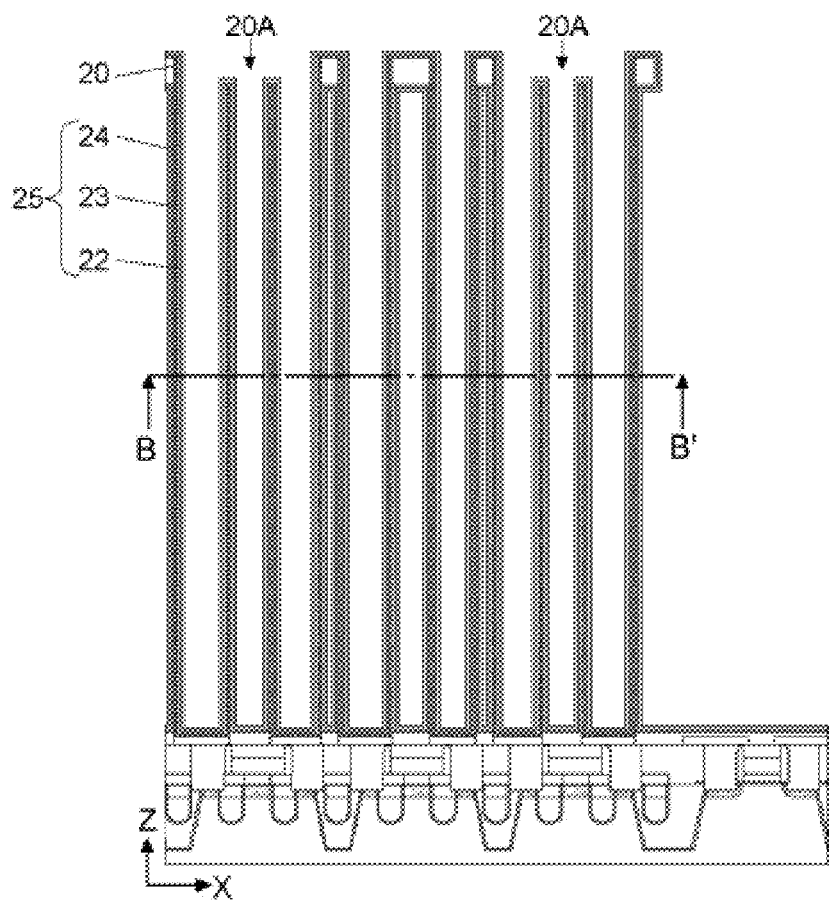
FIG. 11B is a longitudinal cross-sectional view along the line A-A' in FIG. 11A.
Figure 11C:
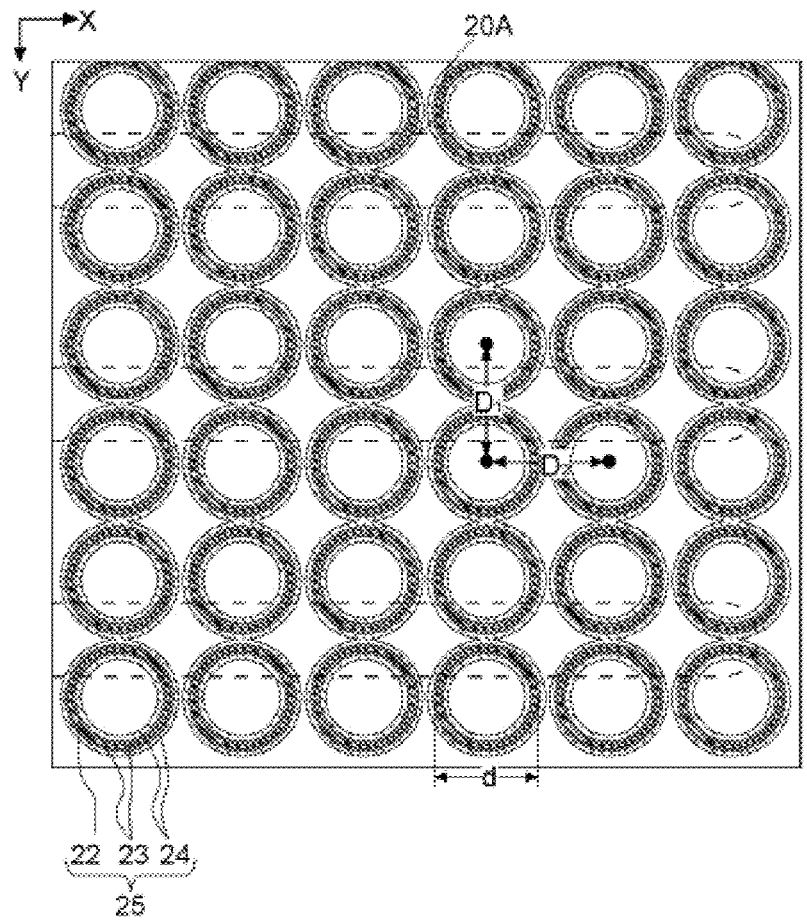
FIG. 11C is a transverse cross-sectional view along the line B-B' in FIG. 11B.

FIG. 11A to FIG. 11C illustrate a state in which processes have been performed as far as the formation of a first conductive film 24 constituting part of an upper electrode in a semiconductor device according to this mode of embodiment, where FIG. 11A is a plan view, FIG. 11B is a longitudinal cross-sectional view along the line A-A' in FIG. 11A, and FIG. 11C is a transverse cross-sectional view along the line B-B' in FIG. 11B.

In this mode of embodiment the arrangement of the capacitors is the same four-way arrangement as in exemplary embodiment 3, but the open portions 20A formed in the support film 20 are formed in such a way as to have a longitudinal direction in a direction (X-direction: second direction) that is different from the first direction. In other words, the portions 20A are formed facing portions between rows of capacitor arrays. In this mode of embodiment there is no particular limit to the length of the open portions 20A.

(Exemplary Embodiment 5)

In the exemplary embodiments described hereinabove, descriptions were given regarding crown-type capacitors in which the outer walls and the inner walls of the storage electrodes 22 are used for capacitance, but the present invention is not restricted to this, and can also be applied to pedestal-type (column-type) capacitors which employ only the outer walls.

Figure 12A:
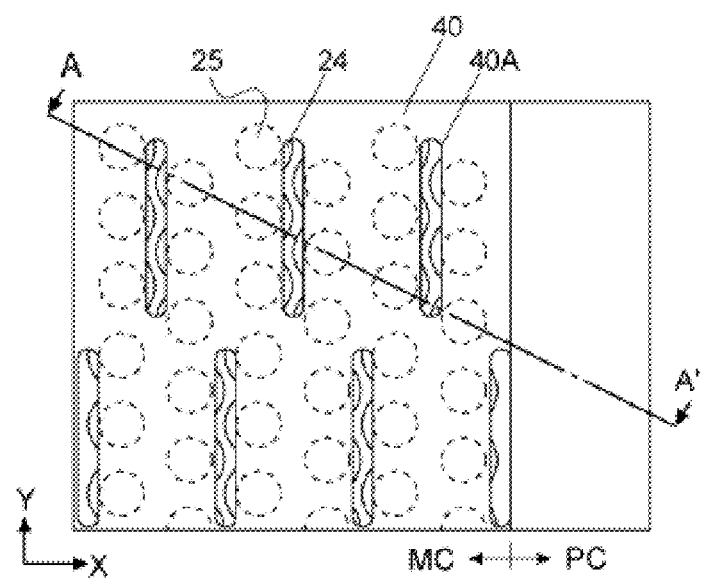
FIG. 12A is a plan view used to describe the arrangement of capacitors in exemplary embodiment 5 of the present invention.
Figure 12B:
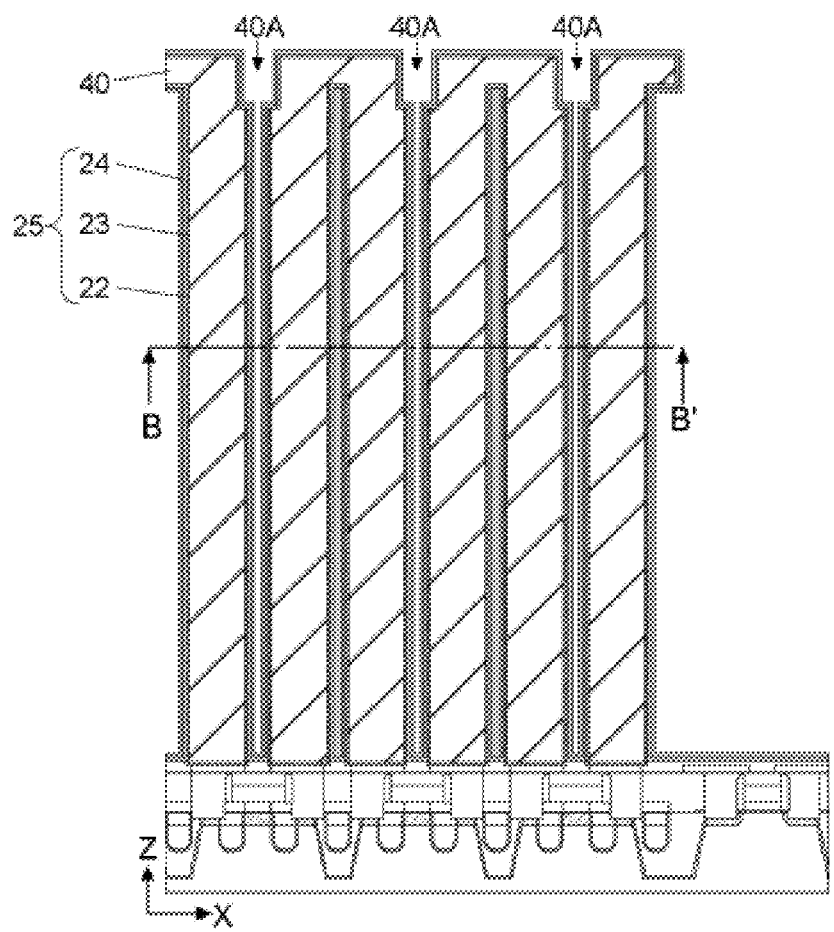
FIG. 12B is a longitudinal cross-sectional view along the line A-A' in FIG. 12A.
Figure 12C:
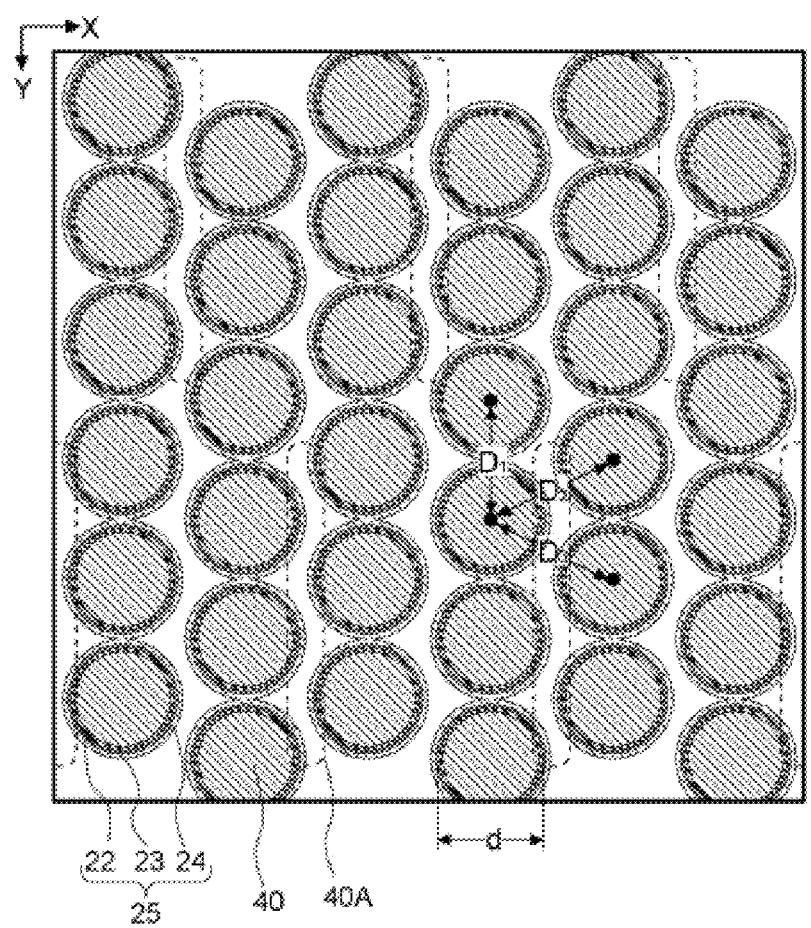
FIG. 12C is a transverse cross-sectional view along the line B-B' in FIG. 12B.

FIG. 12A to FIG. 12C illustrate a state in which processes have been performed as far as the formation of a first conductive film 24 constituting part of an upper electrode in a semiconductor device according to this mode of embodiment, where FIG. 12A is a plan view, FIG. 12B is a longitudinal cross-sectional view along the line A-A' in FIG. 12A, and FIG. 12C is a transverse cross-sectional view along the line B-B' in FIG. 12B.

The capacitors according to this mode of embodiment are formed without forming a support film 20 when the storage electrodes 22 are being formed, and after the storage electrodes 22 have been formed, a silicon nitride film 40 serving as a support film and as an embedded insulating film is formed filling the inner walls of the electrode films 22, open portions 40A are formed, and then the core insulating film 19 is removed to expose the outer walls of the storage electrodes 22. The arrangement of the storage electrodes 22 and the open portions 40A is the same as in exemplary embodiment 1, but may be modified as in the other modes of embodiment. Further, a description was given of a case in which the storage electrodes 22 are in the shape of circular tubes, in the same way as in exemplary embodiment 1, but the shape is not limited to this, and the structure may also be one in which columnar storage electrodes 22 having a solid structure are formed, and these are supported using a support film 20. In this mode of embodiment there is no particular restriction to the length of the open portions 40A, but if they are open in the first direction, the length is preferably similar to that in exemplary embodiment 1.

EXPLANATION OF THE REFERENCE NUMBERS

1 Semiconductor substrate
2 Element isolation region
3a, 3b Gate insulating film
4 Gate electrode
5 Embedded insulating film
6a, 6b Diffusion layer
7 Bit contact interlayer film
8 Interlayer insulating film
9 Doped polysilicon film
10 Metal film
11 Cap insulating film
12 Side wall
13 Bit line
14 Peripheral transistor gate electrode
15 Capacitive contact plug
16 Source/drain contact plug
17a Capacitance pad
17b Wiring line layer
18 Stop film
19 Core insulating film
20 Support film
21 Cylinder hole
22 Storage electrode
23 Capacitative insulating film
24 First conductive film
25 Capacitor
26 Filling film (second conductive film)
27 Bonding film
28 Plate electrode
29 Protective oxide film
30, 31 Wiring line contact
32 Wiring line
33 Protective nitride film
40 Silicon nitride film

What is claimed is:

1. A semiconductor device comprising:
capacitors which contain a plurality of crown-type or column-type storage electrodes provided upright in a periodic manner on a semiconductor substrate;
capacitative insulating films covering wall surfaces of the storage electrodes; and
first conductive films on the capacitative insulating films, on the opposite side to the storage electrodes, wherein
in plan view, a first column of the storage electrodes is adjacent to a second column of the storage electrodes,
the first conductive films of the storage electrodes of the first column contact each other, and
the first conductive films of the storage electrodes of the second column are separated from the first conductive films of the storage electrodes of the first column.

2. The semiconductor device of claim 1, wherein, a gap between the storage electrodes of the first column is at most equal to the sum of twice the thickness of the first conductive film and twice the thickness of the capacitative insulating film, and is at least equal to the sum of the thickness of the upper electrode and twice the thickness of the capacitative insulating film.

3. The semiconductor device of claim 2, wherein, a gap between the storage electrodes of the first column and the storage electrodes of the second column is greater than the sum of twice the thickness of the first conductive film and twice the thickness of the capacitative insulating film.

4. The semiconductor device of claim 1, wherein the storage electrodes are connected to a support film having open portions, and each capacitor adjoins only one of the open portions.

5. The semiconductor device of claim 4, wherein the open portions are of a shape having a width and a length, and the width of the open portions is at most equal to the minimum of the distances between the centers of adjacent storage electrodes in the first column or the distances between the centers of the storage electrodes in the first column and the storage electrodes in the second column, and is greater than the sum of twice the thickness of the first conductive film and twice the thickness of the capacitative insulating film.

6. The semiconductor device of claim 5, wherein the open portions have the lengths in a direction in which the storage electrodes of the first column are disposed, and the first conductive films of adjacent that face the open portions are separated from one another.

7. The semiconductor device of claim 5, wherein the open portions have the lengths in a direction different from a direction in which the storage electrodes of the first column are disposed, the first conductive films of storage electrodes of the first column that face the open portions are in contact with one another, and the first conductive films of adjacent storage electrodes of the first and second columns that face the open portions are separated from one another.

8. The semiconductor device of claim 1, wherein the storage electrodes are crown-type storage electrodes, and the capacitative insulating film and the first conductive film are also formed on the inner walls of the circular tube-type storage electrodes.

9. The semiconductor device of claim 8, wherein a second conductive film is formed on the first conductive film to fill voids on the inner wall sides of the storage electrodes and gaps between the storage electrodes.

10. The semiconductor device of claim 1, wherein the storage electrodes are column-type storage electrodes.

11. The semiconductor device of claim 1, wherein
a first storage electrode and a second storage electrode in the first column have a first center-to-center distance,
the first storage electrode in the first column and a third storage electrode in the second column have a second center-to-center distance, and
the first storage electrode in the first column and a fourth storage electrode in the second column have a third center-to-center distance.

12. The semiconductor device of claim 11, wherein the outside surfaces of the storage electrodes have a substantially circular peripheral shape, and the second and third center-to-center distances are greater than the first center-to-center distance.

13. The semiconductor device of claim 11, wherein the outside surfaces of the storage electrodes have an elliptical peripheral shape having a major diameter in the first direction, and the second and third center-to-center distances are equal to or less than the first center-to-center distance.

14. The semiconductor device of claim 11, wherein the storage electrodes are connected to a support film having open portions, the open portions have lengths in a direction in which the storage electrodes of the first column are disposed, and each capacitor adjoins only one of the opening portions.

15. The semiconductor device of claim 11, wherein the storage electrodes are connected to a support film having open portions, the open portions have lengths in a direction different from a direction in which the storage electrodes of the first column are disposed, and each capacitor adjoins only one of the opening portions.

16. The semiconductor device of claim 14, wherein the open portions adjoin, on a first side surface side of the first column of storage electrodes three capacitors respectively.

17. The semiconductor device of claim 1, wherein
a first storage electrode and a second storage electrode in the first column have a first center-to-center distance, and
the first storage electrode in the first column and a third storage electrode in the second column have a second center-to-center distance.

18. The semiconductor device of claim 17, wherein the storage electrodes are connected to a support film having open portions, the open portions have lengths in a direction in which the storage electrodes of the first column are disposed, and each capacitor adjoins only one of the opening portions.

19. The semiconductor device of claim 17, wherein the storage electrodes are connected to a support film having open portions, the open portions have lengths in a direction different from a direction in which the storage electrodes of the first column are disposed, and each capacitor adjoins only one of the opening portions.

20. The semiconductor device of claim 18, wherein the open portions adjoin, on a first side surface side of the first column of storage electrodes, three capacitors respectively.

21. The semiconductor device of claim 1, wherein a third column of the storage electrodes is disposed adjacent to the first column of the storage electrodes on a side opposite to where the second column of storage electrodes are disposed, and the first conductive films of the storage electrodes of the third column are separated from the first conductive films of the storage electrodes of the first column.

* * * * *